United States Patent [19]

Ishiguro et al.

[11] Patent Number: 4,751,581
[45] Date of Patent: Jun. 14, 1988

[54] CONTROL SYSTEM HAVING A PLURALITY OF CONTROL COMMAND SOURCES

[75] Inventors: Satoshi Ishiguro; Mikio Iida, both of Kanagawa; Yoshirou Kaneko, Tokyo; Hirotaka Sugiyama, Kanagawa, all of Japan

[73] Assignee: Sony Corporation, Tokyo, Japan

[21] Appl. No.: 924,335

[22] Filed: Oct. 29, 1986

[30] Foreign Application Priority Data

Nov. 14, 1985 [JP] Japan ................... 60-255771

[51] Int. Cl.⁴ .................... H04N 5/44; H04B 9/00
[52] U.S. Cl. .................... 358/194.1; 340/825.51; 455/353
[58] Field of Search .......... 358/194.1, 188, 181, 358/93; 455/151, 166, 352, 353, 355; 340/825.06, 825.5, 825.51

[56] References Cited

U.S. PATENT DOCUMENTS

| | | | |
|---|---|---|---|
| 4,162,477 | 7/1979 | Munkberg | 340/825.5 |
| 4,513,284 | 4/1985 | Right | 340/825.51 |
| 4,527,204 | 7/1985 | Kozakai | 455/151 |
| 4,598,287 | 7/1986 | Osakabe | 358/194.1 |
| 4,633,514 | 12/1986 | Fimoff | 358/194.1 |

Primary Examiner—Tommy P. Chin
Attorney, Agent, or Firm—Lewis H. Eslinger

[57] ABSTRACT

A control system, for example, for a television receiver comprised of a monitor and a tuner has a plurality of sources of control commands, such as, remote control command receivers associated with the television monitor and tuner, respectively, and a manual control device or keyboard associated with the monitor, a plurality of input terminals connected to the control command sources, respectively, through independent paths and each of which is assigned a predetermined priority in relation to the other input terminals, and a controller for selecting one of the control commands in the order of the predetermined priorities assigned thereto when such control commands are simultaneously received at the respective input terminals, and for producing a control signal for the monitor and/or tuner in correspondence with the selected control command.

11 Claims, 3 Drawing Sheets

CONTROL SYSTEM HAVING A PLURALITY OF CONTROL COMMAND SOURCES

BACKGROUND OF THE INVENTION

1. Field of the Invention

This invention relates generally to a control system which receives a plurality of control commands and performs control operations in accordance with such commands, and more particularly is directed to a control system for a component-type television receiver or the like.

2. Description of the Prior Art

In recent years, there has been a tendency to provide television receivers comprised of separable components, such as, television tuners and monitors. Further, remote controllers for television receivers have also become popular because of the convenience they afford in effecting channel selection, volume control, mode selection and the like. The remote controllers usually employ a beam of infra red light as the transmission medium modulated by a control command. The modulated infra red light beam is received by a remote control command receiver or photosensor built into the television tuner and/or monitor.

One of the advantages of component-type television receivers is the possibility of physically separating the television tuner and television monitor when in use. However, such arrangement of the television tuner and monitor tends to make inconvenient the remote control of the television tuner and/or monitor. Conventional component-type television receivers have the remote control command receiver circuit or photosensor for receiving the infra red light beam from the remote controller built into the television tuner. In such case, if the television tuner is located remotely in respect to the television monitor, when effecting remote control, the user must aim the remote controller toward the television tuner, rather than toward the television monitor which is normally the focus of the user's attention. Therefore, when effecting remote control, the user must divert attention from the screen of the monitor and concentrate instead on accurately aiming the remote controller toward the television tuner.

In view of the foregoing, some recently provided component-type television receivers include remote control command receiver circuits with photosensors installed in both the television tuner and the television monitor, respectively. In such case, remote control can be effected by aiming the remote controller either at the television tuner or the television monitor which may be located relatively far apart. However, if the television tuner and monitor are situated close to each other so that the respective remote control command receiver circuits are simultaneously within range of the infra red light beam from the remote controller, both of the remote control command receiver circuits will respond simultaneously to a single remote control command. This can cause interference between the remote control command receiver circuits in the television tuner and monitor, respectively, and thereby cause difficulties in effecting remote control of the television receiver.

In order to avoid such difficulties due to possible interference between the remote control command receiver circuits in the television tuner and television monitor, respectively, some component-type television receivers have been provided with a control signal input terminal in the television monitor designed to be connected to a control signal output from a controller in the television tuner. In this arrangement, when the control signal input terminal of the television monitor is connected to the control signal output terminal of the television tuner, the remote control command receiver circuit in the television monitor is disabled. In other words, remote control of the television monitor through the remote control command receiver in the television monitor is possible only when the control signal input terminal of the monitor is disconnected from the control signal output terminal of the television tuner. However, such circuits used in the television tuner and the television monitor for the purpose of assigning command priority are relatively complicated and thus expensive. Furthermore, since the remote control command receiver circuit in the television monitor is disabled when the control signal input terminal of the monitor is connected to the control signal output terminal of the television tuner, direct remote control of the television monitor is seriously limited.

OBJECTS AND SUMMARY OF THE INVENTION

Accordingly, it is an object of the present invention to provide a control system which selectively responds to control commands from a plurality of sources, and which is suitable for installation in, for example, component-type television receivers.

Another object of the invention is to provide a control system, as aforesaid, which can selectively respond to control commands from a plurality of sources without disabling any of such command sources or any of the respective remote control command receiver circuits.

A further object of the invention is to provide a control system, as aforesaid, which can effect control in accordance with a selected one of a number of control commands received simultaneously from a plurality of control command sources, with such selection being made in accordance with predetermined priorities.

In accordance with an aspect of this invention, a control system comprises a plurality of sources of control commands having predetermined respective priorities, and controller means including input means connected with the control command sources in parallel through independent paths for receiving the respective control commands, means for producing a control signal in correspondence with one of said control commands received at the input means and means for selecting the one control command in the order of the predetermined priorities when the plurality of control commands are simultaneously received.

In accordance with another aspect of this invention, a control system for an electrical device controlled by way of a plurality of control command sources comprises a plurality of input terminals or interfaces connected to the control command sources through mutually independent paths and each of which is assigned a predetermined priority in relation to the other input terminals, and controller means connected to the input terminals for detecting when at least one of the input terminals receives a control command from the corresponding control command source, selecting one of the input terminals according to the predetermined priorities assigned thereto when a plurality of control commands are received simultaneously and outputting a control signal corresponding to the selected control command for operating the electrical device in accordance with the selected control command.

According to a further aspect of the invention, a control system for video means, such as, a television receiver, which can be controlled from a control panel thereon and from a remote control commander, comprises first and second input terminals for receiving control commands from the control panel and the remote control commander, respectively, through different paths and being assigned respective priorities, and controller means connected to the first and second input terminals for detecting when any one of such input terminals receives a control command, selecting one of the input terminals according to the priorities assigned thereto when control commands are received simultaneously by both of the input terminals and producing a control signal corresponding to the selected control command for operating the video means in accordance with the selected control command.

In accordance with a feature of the invention, when the video means is in the form of a component-type television receiver having a television monitor and a television tuner, each of such components is provided with a remote control command receiver for receiving a remote control command from the remote control commander, the second input terminal is connected to the control command receiver of the television monitor, and a third input terminal is provided which is connected to the control command receiver of the television tuner and has a respective priority assigned thereto. In this case, the controller means is also connected to the third input terminal for selecting the control commands received through the first, second and third input terminals in accordance with the priorities assigned thereto.

The above, and other objects, features and advantages of the invention, will be apparent in the following detailed description of illustrative embodiments which is to be read in connection with the accompanying drawings in which corresponding parts are identified by the same reference numerals in the several views.

DESCRIPTION OF THE PREFERRED EMBODIMENTS

Figure 1:
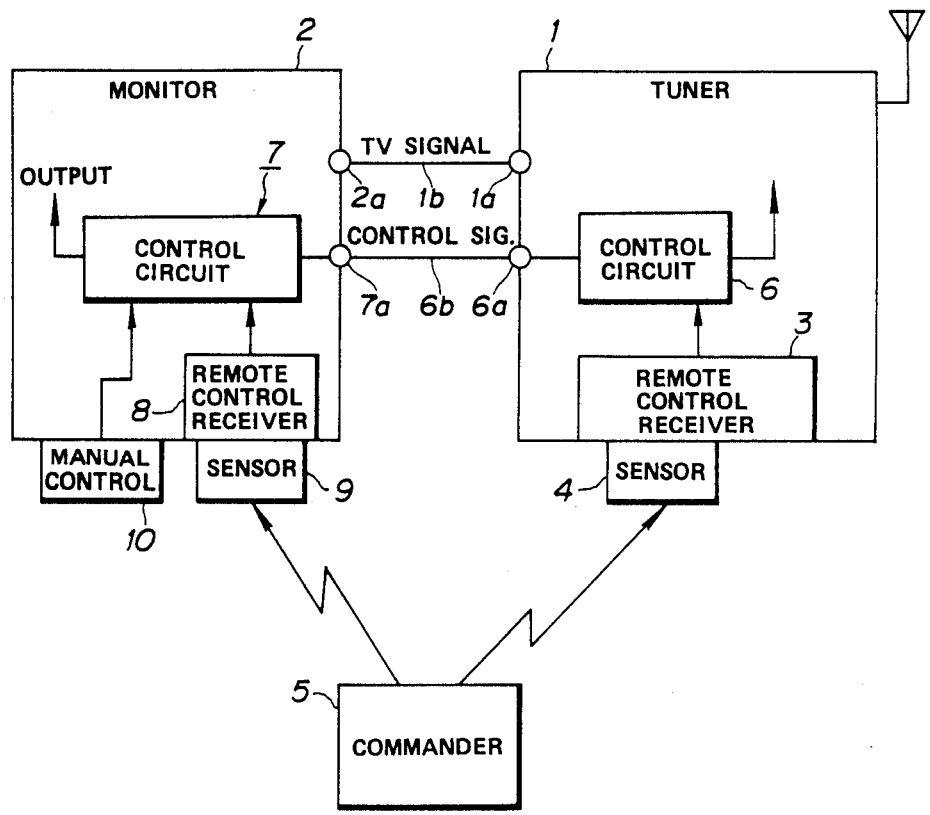
FIG. 1 is a schematic block diagram showing a control system according to an embodiment of the invention employed in connection with a component-type television receiver.

Referring to the drawings in detail, and initially to FIG. 1 thereof, it will be seen that a control system according to an embodiment of this invention is there shown applied to a component-type television receiver which is comprised of a television tuner 1 and an independent television monitor 2. However, it will be appreciated that the invention is also applicable to control systems for other devices adapted to be controlled by a plurality of control commands issuing from respective independent control command sources.

As shown in FIG. 1, television tuner 1 has a remote control receiver circuit 3 which receives a control command from a sensor 4 which detects such control command from a remote controller or commander 5. In those cases where the remote controller or commander 5 provides a frequency-modulated infra red light beam representative of the control command, the sensor 4 may be constituted by a photosensor. The electrical output from sensor 4 which corresponds to the detected control command is demodulated in circuit 3 and the resulting electrical signal is applied to a control circuit 6 which produces a corresponding control command signal for controlling the operation of television tuner 1 and/or the operation of television monitor 2. If the received control command orders adjustment of the television monitor 2, for example, as in the case of a luminance control command, a chrominance control command or the like, the corresponding control command signal produced by control circuit 6 in television tuner 1 is transmitted from a control signal terminal 6a through a control line 6b to a control signal terminal 7a of a control circuit 7 in television monitor 2. On the other hand, if the control command received by sensor 4 from remote controller 5 orders adjustment of the television tuner 1, for example, as in the case of TV channel selection, mode selection or the like, the corresponding control command signal produced by control circuit 6 is supplied to the usual internal tuner circuits (not shown) for effecting the required operations.

The television tuner 1 is also shown to have a television signal output terminal 1a connected through a line 1b to a television signal input terminal 2a of the television monitor 2 for transmitting to the latter the television signal, that is, the video and audio signals being received in a selected television channel. The television monitor 2 has conventional television signal reproducing circuits (not shown) for reproducing or displaying the received television signal on the screen of a cathode ray tube included in monitor 2.

The television monitor 2 also has a remote control receiver circuit 8 associated with a sensor 9, for example, in the form of a photosensor, for receiving or detecting a control command issuing from the remote controller or commander 5 in the form of a suitably modulated infra red light beam. Once again, the electrical signal issuing from sensor 9 in response to its detection of a control command is demodulated in remote control receiver circuit 8, and the resulting control command signal is applied to control circuit 7 of television monitor 2.

Control circuit 7 is also shown on FIG. 1 to be connected to a manual input device 10, such as, a keyboard mounted on television monitor 2. Therefore, control circuit 7 of television monitor 2 receives control command signals directly from the manual input device or keyboard 10, and also receives control command signals emanating from remote controller or commander 5 and reaching control circuit 7 either by way of sensor 9 and remote control receiver circuit 8 or by way of sensor 4, remote control receiver circuit 3 and control circuit 6. When the control command signal is received by control circuit 7 directly from manual control or input device 10 or remotely from commander 5 through sensor 9 and circuit 8, and orders adjustment of television tuner 1, control circuit 7 of monitor 2 transmits the required control signal to control circuit 6 of television tuner 1 by way of control signal terminal 7a, control line 6b and control signal terminal 6a.

Figure 2:
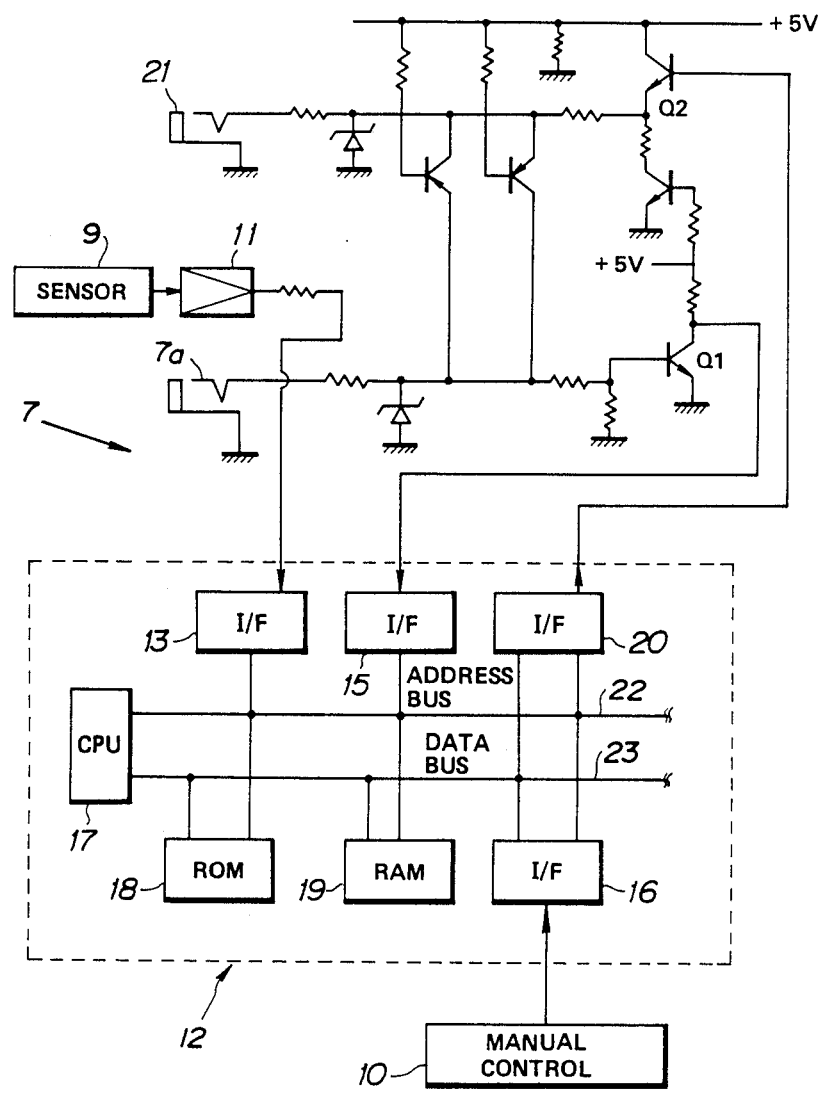
FIG. 2 is a circuit diagram showing the control system of FIG. 1 in greater detail.

Referring now to FIG. 2 in which control circuit 7 of television monitor 2 is shown in greater detail, it will be seen that an amplifier 11 in remote control receiver circuit 8 is connected to sensor 9 so as to provide a corresponding electrical control command signal to an input interface (I/F) 13 of a microprocessor 12. The microprocessor 12 is also shown to have an input interface 15 connected through an amplifying circuit including a transistor $Q_1$ with the control signal terminal 7a. Thus, input interface 15 is adapted to receive electrical control command signals from control circuit 6 of the television tuner via terminal 6a, line 6b and terminal 7a. The microprocessor 12 further has an input interface 16 connected to the manual input or control device 10 for receiving electrical control command signals directly from the latter. A single output interface 20 of microprocessor 12 is connected to a conventional control circuit (not shown) of the television monitor 2 through an amplifying circuit including a transistor $Q_2$ and an output terminal 12.

As is well known, microprocessor 12 includes a central processing unit (CPU) 17, a read only memory (ROM) 18 and an random access memory (RAM) 19. CPU 17 is suitably connected to input interfaces 13,15 and 16, output interface 20, ROM 18 and RAM 19 through an address bus 22 and a data bus 23. Microprocessor 12 is designed to perform various conventional television monitor control operations, such as, synchronization control, luminance control, chrominance control, deflection control, and the like, as is well known, in addition to effecting the hereinafter described control command selection.

In the arrangement described above with reference to FIG. 2, microprocessor 12 receives electrical control command signals from remote control receiver circuit 8 through input interface 13. Microprocessor 12 also receives electrical control command signals produced by control circuit 6 of television tuner 2 through input interface 15, and the electrical control command signals produced by manual input device 10 through input interface 16. Microprocessor 12 processes these inputs applied to input interfaces 13,15 and 16, and selects one of these inputs to provide a corresponding control signal through output interface 20 and output terminal 21. The selection of one of the inputs applied to input interfaces 13,15 and 16 is effected by microprocessor 12 in accordance with predetermined priorities assigned to the various inputs. For example, in the illustrated embodiment, control command signals supplied through input interface 16 from manual input or control device 10 are given the highest priority, while electrical control command signals applied to input interface 13, that is, control command signals corresponding to remote control commands detected by sensor 9 of television monitor 2 are given the lowest priority. Therefore, if control command signals were received simultaneously at input interfaces 16 and 15 from the manual input device 10 and control circuit 6 of television tuner 1, respectively, microprocessor 12 would selects the control command signal from manual input device 10 and correspondingly controls the television monitor circuit through the output interface 20. The simultaneously received electrical control command signal applied to input interface 15 from control circuit 6 would be ignored. Similarly, if control command signals are simultaneously received from manual input device 10 and remote control receiver circuit 8 of the television monitor, the control command signal from the manual input device 10 would be selected for controlling the television monitor, and the control command signal from remote control receiver circuit 8 would be ignored.

The operations of microprocessor 12 for implementing the control of the component-type television receiver according to the present invention will now be described with reference to the flow chart of FIG. 3. In general, it will be appreciated that CPU 17 of microprocessor 12 executes the control program illustrated on FIG. 3, and which is stored in ROM 18.

At the start of the program, in a conventional main routine (a), microprocessor 12 performs general control functions for the television monitor 2, such as, control of synchronization, luminance, chrominance and deflection, so as to prepare for reproduction of the television signal, and also performs other associated tasks, such as, the generation of time display signals. The main routine (a) is not described in detail, as it is conventional and not essential to the present invention.

At the completion of the main routine, the program proceeds to step (b) in which it is determined whether or not a control command signal has been received at any of the input interfaces 13,15 and 16. If no control command signals have been received at any of the interfaces 13,15 and 16, the program returns or recycles to step (a).

If it is determined in step (b) that a control command signal has been received at any of the input interfaces 13,15 and 16, the program proceeds to step (c) in which it is determined whether or not the control command signal is being received at input interface 16.

If it is determined in step (c) that a control command signal is received at interface 16, the program proceeds to step (d) in which a control signal corresponding to such control command signal applied to input interface 16 is output through output interface 20 and is transmitted to output terminal 21 by way of the amplifier circuit including transistor $Q_2$. It will be appreciated that the foregoing output through interface 20 of a control signal corresponding to the control command signal applied to input interface 16 occurs whether or not other control command signals are being simultaneously received at input interface 13 and/or input interface 15. After step (d), that is, the output at interface 20 of a control signal corresponding to the control command signal input to interface 16, the program returns to step (a).

If it is determined in step (c) that a control command signal is not being received at input interface 16, the program proceeds from step (c) to step (e) in which it is determined whether or not a control command signal is being received at input interface 15.

If it is determined in step (e) that a control command signal is being received at input interface 15, the program proceeds to step (f) in which a control signal corresponding to the control command signal applied to input interface 15 is output from interface 20 and transmitted to output terminal 21 by way of the amplifier circuit including transistor $Q_2$. Once again, it will be appreciated that the output from interface 20 of a control signal corresponding to a control command signal being received by input interface 15 from control circuit 6 in television tuner 1 occurs in step (f) whether or not another control command signal is being simultaneously received at interface 13. At the completion of step (f), that is, after the output at interface 20 of a control signal corresponding to a control command signal being received at input interface 15, the program returns to step (a), that is, to the main routine.

If it is determined, in step (e), that no control command signal is being received at input interface 15, then the program proceeds to step (g) in which it is determined whether or not a control command signal is being received at input interface 13.

If it is determined in step (g) that no control command signal is being received at input interface 13, the program returns to the main routine at step (a). On the other hand, if it is determined, in step (g) that a control command signal is being received at input interface 13, the program proceeds to step (h) at which a control signal corresponding to the control command signal being received at input interface 13 from remote control receiver 8 is supplied through output interface 20 to output terminal 21 by way of the amplifier circuit including transistor $Q_2$. After such control signal is provided to output terminal 21 in step (h), the program returns to the main routine at step (a).

The program executed by microprocessor 12, as described above with reference to FIG. 3, ensures that a control command signal applied to any one of the input terminals or interfaces 13, 15 and 16 of the microprocessor 12 will result in a corresponding output by way of the output interface 20. Further, when a plurality of control command signals are received simultaneously by input interfaces 13, 15 and 16, a control signal will be provided at output interface 20 corresponding only to the control command signal received at that one of input interfaces 13, 15 and 16 having the highest priority. In the described embodiment of the invention, the order of the priorities is as follows: the highest priority is given to control command signals applied to input interface 16 from manual input device 10; the next highest priority is given to control command signals applied to input interface 15 from the control circuit 6 of television tuner 1 by way of control input terminal 7a; and the lowest priority is given to control command signals received at input interface 13 from amplifier circuit 11 of remote control receiver 8.

In view of the foregoing, if someone operates the remote controller or commander 5 to issue a remote control command while, for example, the color or picture of monitor 2, is being adjusted manually by way of the manual input device 10, a control signal corresponding to the control command signal from manual input device 10 would be outputted through interface 20, while the remote control command signal resulting from the operation of remote controller or commander 5 would be ignored. Thus, it is possible to avoid interference between control signals due to operation of the manual input device 10 and due to operation of the remote controller or commander 5, respectively. Similarly, if the modulated infra red beam issuing from remote controller or commander 5 upon operation of the latter is detected by both the photosensors 4 and 9 of tuner 1 and monitor 2, respectively, so that input interfaces 13 and 15 simultaneously receive control command signals, the control command signal applied to input interface 15 will be selected to provide at output interface 20 a control signal corresponding to the control command signal applied from remote control receiver 3 and control circuit 6 of the tuner, while the control command signal applied to input interface 13 from remote control receiver 8 of the monitor will be ignored. Thus, it is also possible to avoid disturbances due to the interference between control command signals arising when the infra red beam from remote commander 5 is simultaneously detected by sensors 4 and 9. In other words, no problems will arise when tuner 1 and monitor 2 are located near to each other.

As earlier indicated, in a previously proposed control system for a component-type television receiver, a special circuit is provided for disabling the remote control receiver of the television monitor when the control signal input terminal of the monitor is connected to the control signal output terminal of the tuner which includes another remote control receiver for responding to the remote controller or commander. Thus, remote control of the television monitor through the remote control command receiver in the television monitor is possible only when the control signal input terminal of the monitor is disconnected from the control signal output terminal of the television tuner. As distinguished from the foregoing, in the described embodiment of the present invention, even when the line 6b connects the control signal input terminal 7a of the monitor with the control signal output terminal 6a of the tuner, transmission between the amplifier 11 of the remote control receiver 8 of the monitor and interface 13 is not obstructed, except that, when control command signals are simultaneously received at interfaces 13 and 15, the control command signal applied to interface 15 from control circuit 6 of the tuner 1 will have priority. Therefore, remote control of the monitor 2 can be effected by means of the commander 5 merely by aiming the latter directly at sensor 9 and, at any time, remote control of tuner 1 can be effected merely by redirecting remote commander 5 so as to aim the same at sensor 4. At such times, there is no danger that interference will result from the inadvertent detection of the infra red beam by both sensors 4 and 9. Thus, tuner 1 and monitor 2 can be disposed at any desired positions relative to each other without affecting the efficacy of the remote and direct controls thereof.

It is also to be appreciated that no special circuitry is required for achieving the control system according to the present invention by assigning the necessary priorities to the various control command signals. It will be seen that the program consisting of the steps (b) to (h) on FIG. 3 is merely added to the existing main program or routine already stored in microprocessor 12. When such added program is being executed, microprocessor 12 operates as a control signal selecting means for determining the relative priorities of a plurality of control command signals that are received simultaneously at respective input interfaces.

In the program described above with reference to FIG. 3, if a control command signal having a relatively higher priority is received at interface 16 or 15 at a time when a control signal is already issuing from output interface 20 in response to the earlier commenced reception of a control command signal of lower priority at the interface 15 or 13, respectively, the later reception of the control command signal is ignored and the output of control signal from interface 20 is not affected. However, if desired, the program according to the invention may be modified so that, at any time that a control command signal of relatively higher priority is received by the respective interface 16 or 15, the control signal output at interface 20 will be changed to reflect the reception of such control command signal of higher priority. For example, if it is determined, in step (e) of FIG. 3, that a control command signal is being received at input interface 15, the following sub-routine may be executed in place of the earlier described step (f):

A control signal corresponding to the control command signal received at interface 15 is provided from output interface 20 while checking whether or not a control command signal of higher priority is being received at interface 16. If a control command signal of higher priority is received at interface 16 while a control signal is issuing from output interface 20 in correspondence to a control command signal of lower priority received at interface 15, the output of a control signal corresponding to the signal applied to input interface 15 is interrupted or replaced by an output control signal from interface 20 corresponding to the control command signal then being applied to input interface 16.

Figure 3:
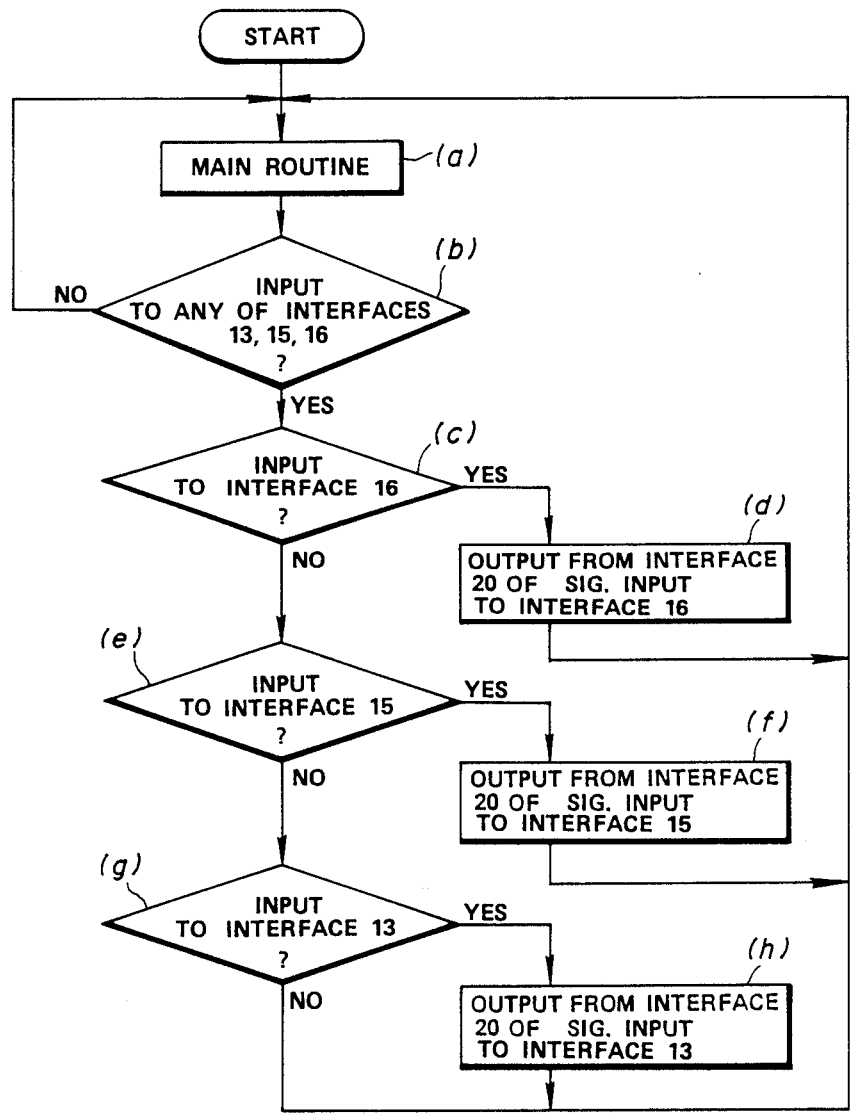
FIG. 3 is a flow chart to which reference will be made in explaining the operation of the control system of FIGS. 1 and 2.

Similarly, step (h) described above with reference to the embodiment shown on FIG. 3 can be replaced by the following sub-routine:

During the output from interface 20 of a control signal corresponding to a low priority control command signal received at input interface 13, the program continues to check whether or not any higher priority control command signals are then being received at interfaces 16 and 15. If a control command signal is received at interface 16, the outputting of a control signal corresponding to the input at interface 13 is interrupted, and a control signal corresponding to the input at interface 16 is issued from output interface 20 regardless of whether or not interface 15 is then also receiving a control command signal. If, after the commencement of the receiving of a control command signal at interface 13 and the issuance of a corresponding control signal from output interface 20, an additional control command signal is received only at interface 15, then the control signal issuing from interface 20 in correspondence to the control command signal received at interface 13 is interrupted, and the output control signal from interface 20 then corresponds to the input to higher priority interface 15.

It will be seen that, in the above described modification of the program according to the present invention, at all times, the control signal issuing from output interface 20 corresponds to the highest priority control command signal then being received at any of the input interfaces 13,15 and 16.

By way of summary, in accordance with the present invention, a control system is provided with a plurality of inputs for receiving control command signals of different priorities by way of independent paths, a single output for emitting a control signal, and control signal selecting means which is operative to provide, at the single output, a control signal corresponding to the highest priority control command signal received by one or more of the inputs.

Although an illustrative embodiment of the present invention, and modifications thereof, have been described in detail herein with reference to the accompanying drawings, it is to be understood that the invention is not limited to that precise embodiment and the specifically described modifications, and that various changes and further modifications may be effected therein by one skilled in the art without departing from the scope or spirit of the invention as defined in the appended claims.

What is claimed is:

1. A control system for a television monitor and a television timer each having a remote control command receiver, comprising:
   a plurality of sources of control commands, at least one being connected only to said television monitor and at least another being a remote control commander for providing remote control commands receivable by the remote control command receivers of both said television monitor and said televison tuner, said plurality of sources having predetermined respective relative priorities; and controller means including input means connected with said one source and said remote control command receivers in parallel through independent paths for receiving the respective control commands, means arranged in said television tuner for producing a control signal in correspondence with one of said control commands received at said input means, and means for selecting said one of said control commands including a control command corresponding to said control signal, when simultaneously received at a said input means, in the order of said predetermined relative priorities.

2. A control system as in claim 1; wherein said input means includes a plurality of interfaces, each of which is connected to a corresponding one of said control command sources through a coresponding one of said independent paths.

3. A control system as in claim 2; wherein each of said plurality of interfaces is assigned a priority, and said controller means selects control commands according to the priorities assigned to the respective interfaces.

4. A control system for a video system incluidng a video monitor and a television tuner, each having a remote control command receiver and each being controlled by way of a plurality of control command sources one of which is a remote control commander for providing remote control commands receivable by the remote control command receivers of both said monitor and tuner, comprising:
   a plurality of input terminals at said video monitor and television tuner and being connected to said control command sources through mutually independent paths, at least a pair of said input terminals for directly connecting said video monitor with said televison tuner, and each of which is assigned a predetermined priority in relation to the other input terminals; and controller means connected to said input terminals for detecting when at least one of said input terminals receives a control command from a corresponding control command source, selecting one of said input terminals according to the predetermined priorities assigned to said input terminals when a plurality of control commands are received simultaneously, and outputting a control signal corresponding to the selected control command for operating said video system in accordance with said selected control command.

5. A control system as in claim 4; wherein said controller means checks said input terminals for the presence of control commands thereat in an order corresponding to said priorities.

6. A control system as in claim 5; which is in the form of a digital circuit including a plurality of interfaces serving as said input terminals, respectively.

7. A control system for video means that can be controlled from a control panel and from a remote control commander wherein said video means includes a television monitor and a television tuner, each having a remote control command receiver for receiving a remote control command from said remote control commander, comprsiing:
   first and second input terminals for receiving control commands from said control panel and said remote control commander, respectively, through different paths, said second input terminal being connected to said control command receiver of said television monitor; and further comprising a third input terminal connected to said control command receiver of said television tuner, said first, second, and third input terminals being assigned respective priorities; and controller means connected to said first, second, and third input terminals for detecting when any one of said input terminals receives a control command, selecting one of said input terminals according to said priorities assigned thereto when control commands are received simultaneously by both of said first and second input terminals, and producing a control signal corresponding to the selected control command for operating said video means in accordance with said selected control command.

8. A control system as in claim 7; wherein said controller means sequentially checks said input terminals in the order of said priorities for the receipt of said control commands thereby.

9. A control system as in claim 8; which is in the form of a digital circuit including a plurality of interfaces serving as said input terminals, respectively.

10. A control system as in claim 7; wherein said video means includes a television monitor and a television tuner, each having a remote control command receiver for receiving a remote control command from said remote control commander, and said second input terminal is connected to said control command receiver of said television monitor; and further comprising a third input terminal connected to said control command receiver of said television tuner and also having a respective priority assigned thereto.

11. A control system as in claim 10; wherein said controller means is connected to said third input terminal for selecting the control commands received through said first, second and third input terminals according to said priorities assigned thereto.

* * * * *

UNITED STATES PATENT AND TRADEMARK OFFICE
CERTIFICATE OF CORRECTION

PATENT NO. : 4,751,581
DATED : June 14, 1988
INVENTOR(S) : Satoshi Ishiguro et al It is certified that error appears in the above-identified patent and that said Letters Patent is hereby corrected as shown below:

```
Column 10, line 20, "coresponding" should read --corresponding--
          line 26, "incluiding" should read --including--;
          line 65, "comprsiing" should read --comprising--.
```

Signed and Sealed this

Fourteenth Day of February, 1989

Attest:

DONALD J. QUIGG

Attesting Officer

Commissioner of Patents and Trademarks